United States Patent [19]
Cho et al.

[11] Patent Number: 5,999,390
[45] Date of Patent: Dec. 7, 1999

[54] INPUT BUFFER CIRCUIT FOR SEMICONDUCTOR DEVICE

[75] Inventors: Baek-Hyung Cho; Choong-Keun Kwak; Ho-Geun Shin, all of Suwon, Rep. of Korea

[73] Assignee: Samsung Electronics Co., Ltd., Suwon, Rep. of Korea

[21] Appl. No.: 09/122,076

[22] Filed: Jul. 24, 1998

[30] Foreign Application Priority Data

Apr. 12, 1997 [KR] Rep. of Korea ........................ 97-65842

[51] Int. Cl.⁶ ........................................................ H02H 3/18
[52] U.S. Cl. .......................... 361/86; 361/91.1; 361/91.5
[58] Field of Search .................................. 361/86, 56, 91, 361/111, 91.1, 91.5

[56] References Cited

U.S. PATENT DOCUMENTS 4,980,792 12/1990 Kertis et al. .............................. 361/91

*Primary Examiner*—Michael J. Sherry
*Attorney, Agent, or Firm*—Howrey & Simon

[57] ABSTRACT

A CMOS input buffer for semiconductor devices, that is capable of protecting its MOS transistors from gate oxide breakdown due to the application of high voltage greater than a normal power supply voltage.

9 Claims, 3 Drawing Sheets

INPUT BUFFER CIRCUIT FOR SEMICONDUCTOR DEVICE

FIELD OF THE INVENTION

The present invention relates generally to integrated circuit devices and, more particularly, to input buffers for integrated semiconductor circuit device testing.

BACKGROUND OF THE INVENTION

In general, semiconductor device manufacturers conduct testing for device reliability in the evaluation of new products, design changes, and process changes. Most manufacturers subject their parts to a short period of accelerated stress testing prior to shipment in an effort to eliminate infant mortality failures. There is also a serious effort with many manufacturers to eliminate the infant mortality phenomena by some form of stress testing during wafer sorting. Even after the introduction of a new product or package, on-going monitoring of reliability and quality normally continues throughout the production life cycle. On-going reliability testing is normally performed both in order to monitor device performance and to accumulate statistical information.

As a result of such testing, possible wear-out mechanisms are identified and eliminated, either through modifications in the process or in the design. However, the manufactured devices may continue to exhibit early life failures or infant mortality failures. Examples of such defects includes oxide pinholes, photoresist or etching defects that cause near-opens or shorts, and contamination on the chip or in the package. A number of stress tests have been developed to accelerate the effects of various failure mechanisms. By subjecting a device to extreme operating conditions for a short period of time, such as for example, putting a device into a condition of abnormally high temperature and high voltage (such a test is called "burn-in test"), one can with some specified confidence level predict life and device performance under more normal conditions. In such a burn-in test, a static super voltage (about 7.0 to 8.5 volts) is applied to one or more pins of a device. Integrated semiconductor memory devices such as DRAMs and SRAMs typically include various input buffers for receiving externally provided address signals, data signals, and control signals via their pins (or pads). Each buffer acts as an input stage to circuits within the memory devices.

FIGS. 1 and 2 illustrate examples of the most widely used MOS input buffers for semiconductor devices. Referring first to FIG. 1, the CMOS input buffer 50 includes two serially-connected inverters 6 and 12. The inverter 6 is composed of a p-channel MOS (hereinafter abbreviated as PMOS) transistor 10 and an n-channel MOS (abbreviated as NMOS) transistor 11. The complementary MOS (abbreviated as CMOS) buffer 50 receives an externally applied input signal INE and converts the external signal into a compatible internal signal INI (or $\overline{INI}$). The gates of the CMOS transistor pair 10 and 11 are supplied with the input signal INE. At the drain junction of the CMOS transistor pair 10 and 11, the internal signal INI compatible with the external signal INE is produced.

Referring now to FIG. 2, the CMOS input buffer circuit 60 includes a NOR gate 8 and an inverter 17. The NOR gate 8 is formed of PMOS transistors 13 and 14, and NMOS transistors 15 and 16. An input signal INE is externally applied to the gates of the transistors 14 and 15. An external control signal such as chip select signal $\overline{CS}$ is applied to the gates of the transistors 13 and 16.

Gate oxide is an important element of MOS transistors. This thin dielectric layer can break down, resulting in gate shorts, during a long or very strong application of electric field across the oxide. Oxide breakdown is generally believed to be caused by positive charge buildup. Therefore, in a reliability test mode such as burn-in test, input buffer oxide breakdown of the targeted device may occur due to the high voltage which is applied to the device for reliability evaluation. More specifically, in the input buffer 50 of FIG. 1, the NMOS transistor 11 is turned on when a super voltage input signal is applied to the input terminal of the CMOS inverter 6, but the PMOS transistor 10 is turned off. The drain voltage of the PMOS transistor 10 is then about Vss (i.e., 0 volt) while the source voltage thereof is Vdd. The difference of gate-source and gate-drain voltages of the PMOS transistor 10 may exert stress on its gate oxide and cause gate oxide breakdown. Similarly, in such an input buffer 60 of FIG. 2, there is a high probability that the gate oxide of the PMOS transistor 14 will be broken down by the stress due to the large difference between its gate-drain and gate-source voltages.

SUMMARY OF THE INVENTION

The present invention is intended to solve the above problems, and accordingly it is an object of the invention to provide a CMOS input buffer for semiconductor devices which is capable of preventing gate oxide breakdown of its MOS transistors due to an application of high voltage.

In order to attain the above object, the present invention provides a CMOS input buffer for semiconductor devices such as SRAMs and DRAMs, which is capable of protecting its MOS transistors from gate oxide breakdown due to the application of a super voltage (e.g., about 7.0 to 8.5 volts) greater than a normal power supply voltage Vdd. The input buffer includes a CMOS input circuit which has at least one NMOS transistor and at least one PMOS transistor, and receives an externally applied input signal and generates an internal signal compatible with the input signal. The input buffer further includes a protection circuit which sets a source-drain voltage (or channel voltage) of at least one of the MOS transistors to zero when a voltage level of the input signal exceeds a predetermined voltage level that is approximate to the power supply voltage or slightly greater than the supply voltage, thereby preventing gate oxide breakdown.

According to another aspect of the present invention, an input buffer includes a first power source for supplying a first power supply voltage Vdd (e.g., 2.0 to 5.0 volts), a second power source for supplying a second power supply voltage Vss (i.e., 0 volt), a CMOS input circuit, a super voltage detecting circuit, and two switches. The CMOS input circuit has an input terminal for receiving an externally applied input signal, a pull-up transistor, a pull-down transistor, and an output terminal for providing an internal signal compatible with the input signal. The pull-up and pull-down transistors are coupled in series between the first and second power sources. The super voltage detecting circuit detects whether a voltage level of the input signal exceeds a predetermined voltage level Vdd+ (may vary with the consideration of device reliability) and generates a voltage detection signal when the voltage level of the externally applied input signal exceeds the predetermined voltage level. One of the switches is coupled between the first power source and the output terminal of the input circuit and in parallel with the pull-up transistor, and is rendered open/closed in response to the voltage detection signal. The other switch is coupled between the pull-down transistor and the second power source, and is rendered open/closed in response to the voltage detection signal.

According to another aspect of the present invention, an input buffer includes a first power source for supplying a first power supply voltage Vdd, a second power source for supplying a second power supply voltage Vss, a CMOS input circuit, a super voltage detecting circuit, and five switches. The CMOS input circuit has a first input terminal for receiving an externally applied input signal, a pull-up transistor, a pull-down transistor, and an output terminal for providing an internal signal compatible with the input signal. The pull-up and pull-down transistors are coupled in series. One of the switches is coupled between the first power source and the pull-up transistor, and is open/closed in response to an externally applied control signal such as chip select signal. A second switch is coupled in parallel with the pull-down transistor, and is open/closed in response to the externally applied control signal. The voltage detecting circuit detects whether a voltage level of the input signal exceeds a predetermined voltage level and generates a voltage detection signal when the voltage level of the input signal exceeds the predetermined voltage level. A third switch is coupled between the first power source and the pull-up transistor and in parallel with the first switch, and is open/closed in response to the voltage detection signal. A fourth switch is coupled between the first power source and the output terminal of the CMOS input circuit, and is open/closed in response to the voltage detection signal. A fifth switch is coupled between the pull-down transistor and the second power source, and is being open/closed in response to the voltage detection signal. In the disclosed embodiments, the switches are formed of MOS transistors.

According to this invention, when the application of the super voltage into the input circuit is detected, the switches substantially force the source and drain voltages of the MOS transistors within the input circuit to the same voltage level (i.e., Vdd), resulting in a decrease in gate oxide stress and protection against gate oxide breakdown.

The foregoing and other objects, features and advantages of the invention will be apparent from the following description of the preferred embodiments of the invention, as illustrated in the accompanying drawings.

DETAILED DESCRIPTION OF THE PREFERRED EMBODIMENTS

Figure 3:
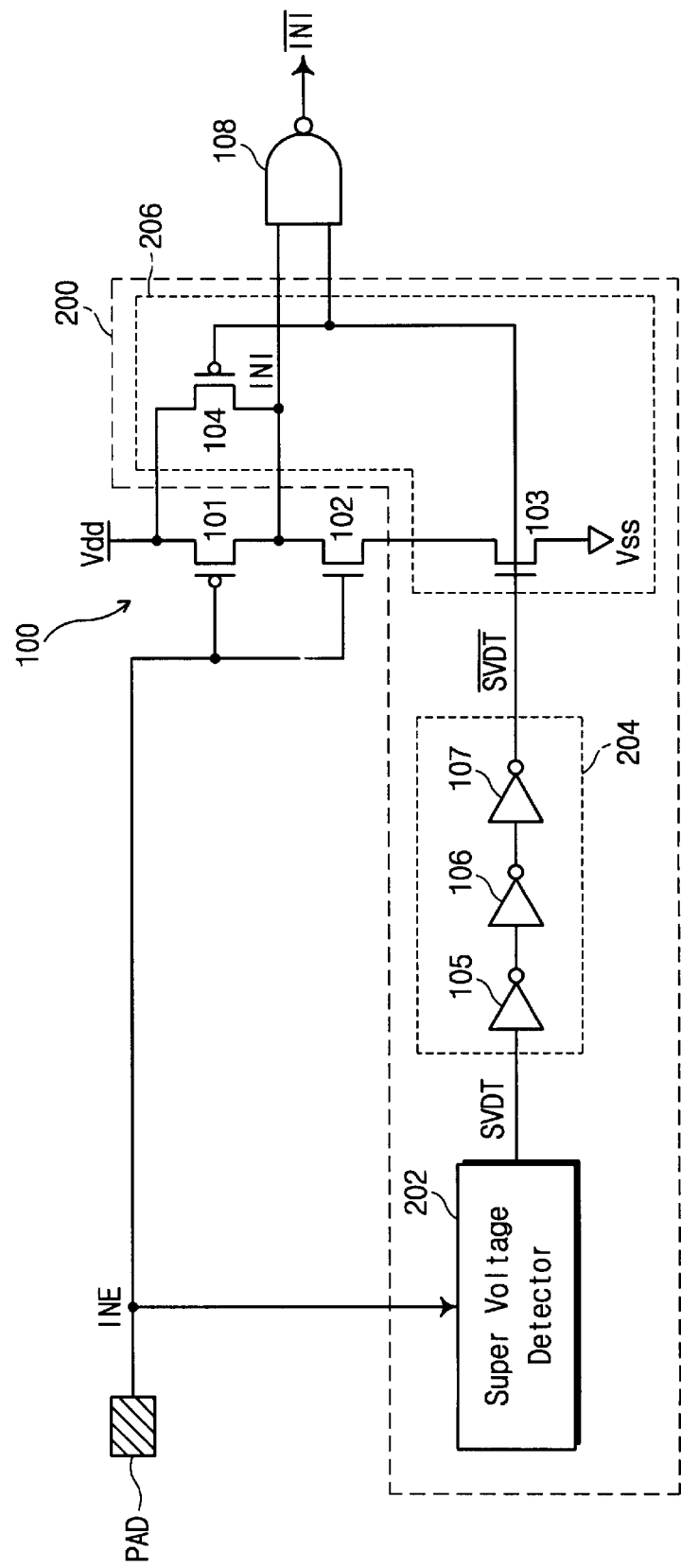
FIG. 3 and 4 illustrate embodiments of MOS input buffers for semiconductor devices according to the present invention.

Referring to FIG. 3, an embodiment of the input buffer according to the present invention is shown. The input buffer includes a CMOS inverter 100 serving as an input circuit, a NAND gate 108 serving as an output circuit, and a gate oxide protection circuit 200. The inverter 100 is made up of a PMOS pull-up transistor 101 and an NMOS pull-down transistor 102. The CMOS transistor pair 101 and 102 are coupled between a first power source for supplying a first power supply voltage Vdd and a second power source for supplying a second power supply voltage Vss. The CMOS inverter 100 receives an externally applied input signal INE and converts the input signal into a compatible internal signal INI of an inverted logic level. The gates of the CMOS transistor pair 101 and 102 are supplied with the external signal INE. At the drain junction of the CMOS transistor pair 101 and 102, the internal signal INI compatible with the input signal INE is produced. The internal signal INI is provided to an input of the NAND gate 108.

The gate oxide protection circuit 200 includes a super voltage detecting circuit 202, a switch circuit 206 and a switch drive circuit 204. The super voltage detecting circuit 202 detects whether a voltage level of the externally applied input signal INE exceeds a predetermined voltage level Vdd+ (may vary with the device design rule) or not, and generates a voltage detection signal SVDT when the voltage level of the input signal exceeds the predetermined voltage level. The switch circuit 206 is composed of a PMOS switching transistor 104 coupled between the first power supply voltage Vdd and the output terminal of the CMOS inverter 100 (i.e., the drain junction of the CMOS transistor pair 101 and 102) and in parallel with the pull-up transistor 101, and an NMOS switching transistor 103 coupled between the pull-down transistor 102 and the second power supply voltage Vss. The switch drive circuit 204 is made up of three serially-connected inverters 105, 106, and 107, and generates a switch driving signal $\overline{SVDT}$. This driving signal $\overline{SVDT}$ is applied to gates of the switching transistors 103 and 104, and to the other input of the NAND gate 108. Each of the switching transistors 103 and 104 is turned on/off in response to the switch driving signal $\overline{SVDT}$.

Figure 1:
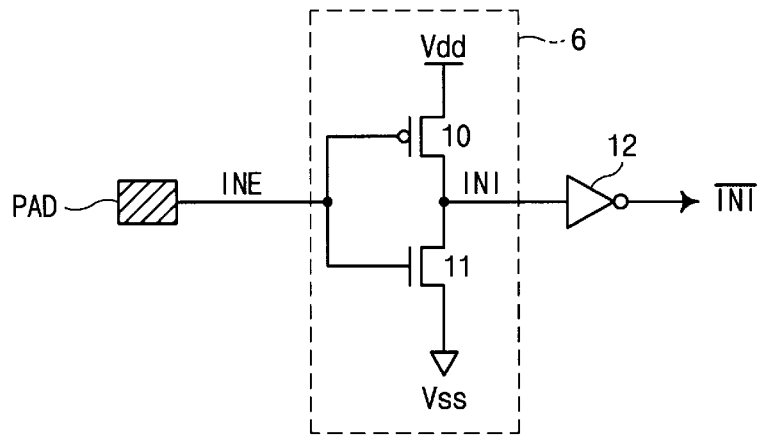
FIGS. 1 and 2 are circuit diagrams of exemplary MOS input buffers for semiconductor devices.

During a stress test mode such as a burn-in test or in an abnormal operation mode, the super voltage detecting circuit 202 generates the detection signal SVDT of high level when the application of an input signal INE of a super voltage (e.g., about 7.0 to 8.5 volts for a burn-in test) is detected. The switch drive circuit 204 then produces the switch driving signal $\overline{SVDT}$ of low level. The switching transistors 103 and 104 are thus turned off and on in response to the switch driving signal $\overline{SVDT}$ of low level, respectively, and the drain voltage of the PMOS transistor 101 is approximately developed to the source voltage thereof (i.e., the power supply voltage Vdd). In this manner, the source and drain voltages of the respective transistors 101 and 102 are approximately equal and the gate-drain voltages (or gate-source voltages) thereof are decreased by Vdd, compared to the conventional CMOS inverter buffer of FIG. 1, when a super voltage is applied, thereby mitigating the gate oxide stress. According to this embodiment, when the application of the super voltage into the CMOS inverter 100 is detected, the switching transistors 103 and 104 force the source and drain voltages of the pull-up and pull-down transistors 101 and 102 to substantially the same voltage level (i.e., Vdd), resulting in a decrease in the gate oxide stress and protection against gate oxide breakdown.

In normal operation modes, the super voltage detecting circuit 202 generates the voltage detection signal SVDT at the low level, and thus the switching transistor 103 is rendered conductive.

If the switching transistors 103 and 104 are replaced with PMOS and NMOS transistors, respectively, the voltage detection signal can be directly applied to their gates. In such a case, there is no need for the switch driving circuit 204.

Figure 4:
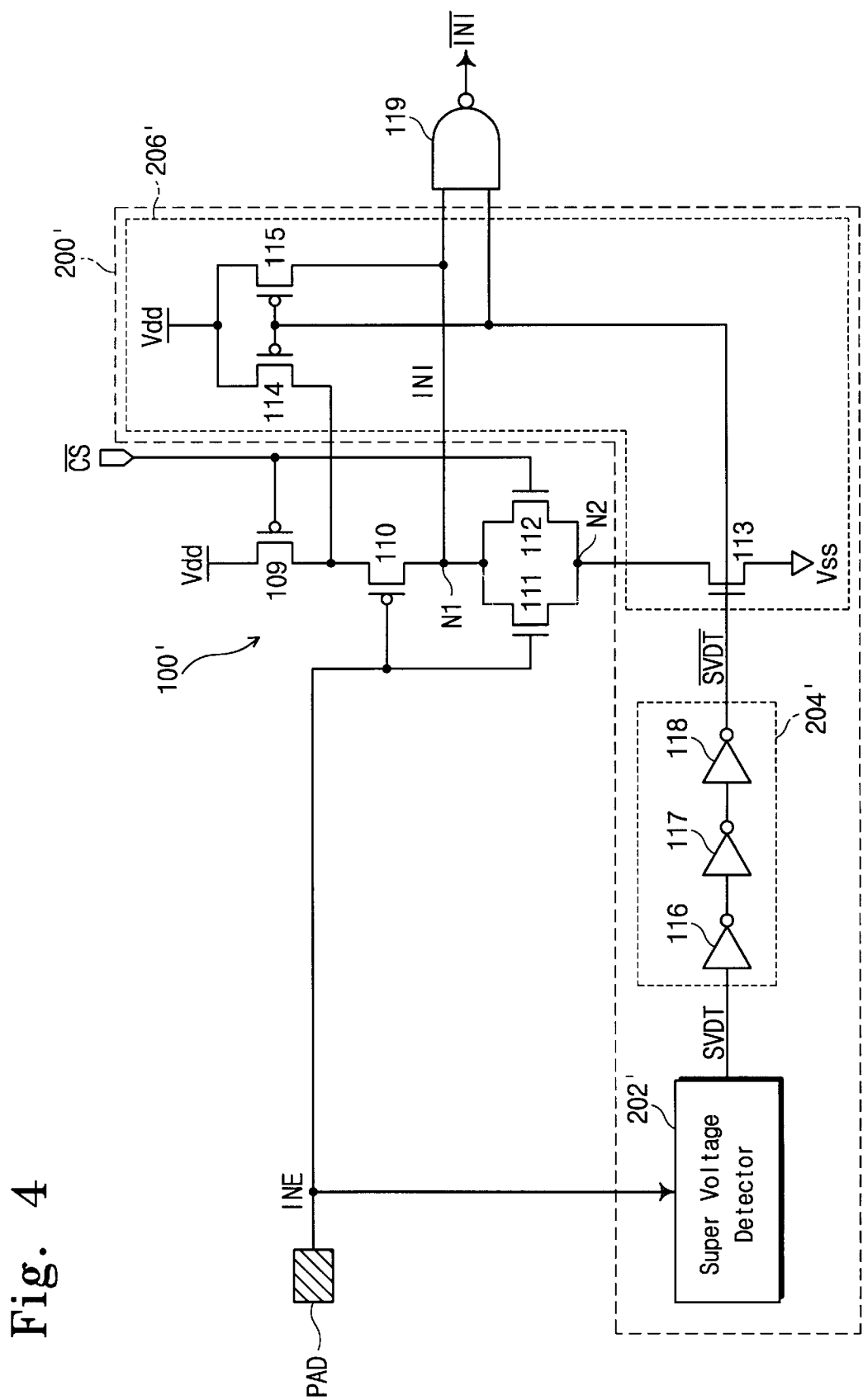

FIG. 4 illustrates another embodiment of the CMOS input buffer circuit according to the present invention. The input buffer includes a NOR gate 100' serving as an input circuit, a NAND gate 119 serving as an output circuit, and a gate oxide protection circuit 200'. The NOR gate 100' is composed of CMOS switching transistors 109 and 112, and CMOS pull-up and pull-down transistors 110 and 111. Gates of the switching transistors 109 and 112 are supplied with an external control signal, i.e., a chip select signal $\overline{CS}$. An input signal INE is externally provided to gates of the pull-up and pull-down transistors 110 and 111.

The gate oxide protection circuit 200' includes a super voltage detecting circuit 202' for detecting whether or not the voltage level of the input signal INE exceeds a predetermined voltage level Vdd+, a switch circuit 206', and a switch drive circuit 204' for driving the switch circuit 206'.

The super voltage detecting circuit 202' generates a voltage detection signal SVDT of the high level when the input signal INE exceeds the voltage level Vdd+. The switch drive circuit 204' is made up of three serially-connected inverters 116, 117, and 118, and generates a switch driving signal $\overline{SVDT}$. Each of the switching transistors 113 and 114 is turned on/off in response to the switch driving signal $\overline{SVDT}$. The switch circuit 206' is composed of MOS switching transistors 113, 114 and 115. The source-drain channel of the PMOS switching transistor 114 is coupled in parallel with that of the switching transistor 109, between the first power supply voltage $V_{dd}$ and the PMOS pull-up transistor 110, and the gate of the transistor 114 is supplied with the switch drive signal $\overline{SVDT}$ from the switch drive circuit 204'. The channel of the PMOS switching transistor 115 is coupled between the first power source $V_{dd}$ and the output terminal of the NOR gate 100'. The gate of the transistor 115 is also supplied with the switch drive signal $\overline{SVDT}$. The transistors 114 and 115 are turned on/off in response to the switch drive signal $\overline{SVDT}$. The source-drain channel of the NMOS transistor 113 is coupled between the pull-down transistor 111 (or the switching transistor 112) and the second power supply voltage (i.e., ground voltage) Vss, and the gate thereof is supplied with the switch drive signal $\overline{SVDT}$. The CMOS NOR gate 100' receives the input signal INE and control signals $\overline{CS}$, and generates the internal signal INI compatible with the input signal INE. The internal signal INI is provided to an input of the NAND gate 119.

Figure 2:
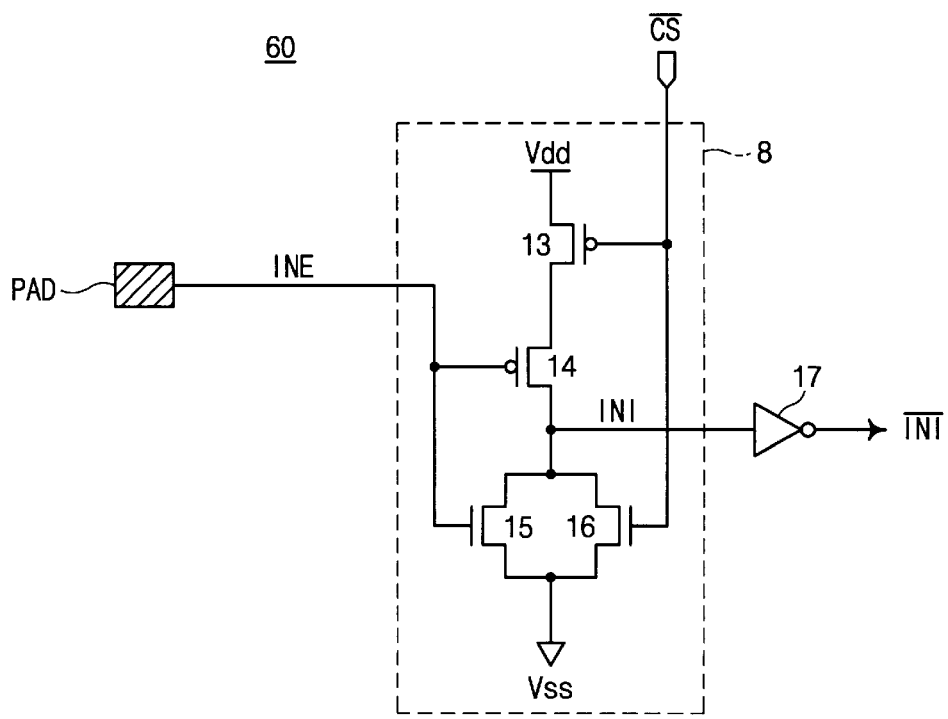

During a stress test mode or in an abnormal operation mode, the super voltage detecting circuit 202' generates the detection signal SVDT of high level when the application of the input signal INE of a super voltage (e.g., about 7.0 to 8.5 volts for a burn-in test) is detected. The switch drive circuit 204' then produces the switch driving signal $\overline{SVDT}$ of low level. Switching transistor 113 is turned off and switching transistors 114 and 115 are turned on in response to the switch driving signal $\overline{SVDT}$ of low level. The drain and source voltages of the transistors 110 and 111 to which the super voltage is applied are approximately equal to the power supply voltage Vdd. The source and drain voltages of the CMOS transistor pair 110 and 111 are approximately equal and the gate-drain voltage (or gate-source voltage) thereof is decreased by Vdd, compared to the conventional CMOS inverter buffer of FIG. 2, when a super voltage is applied, thereby mitigating the gate oxide stress. As described above, when the application of a super voltage into the input buffer is detected, the source and drain voltages of the transistors 110 and 111 are substantially set to the same voltage level (i.e., Vdd) by the switching transistors 113 to 115, resulting in a decrease in the gate oxide stress and protection against gate oxide breakdown.

In normal operation modes, the super voltage detecting circuit 202' generates the voltage detection signal SVDT of the low level, and thus the switching transistor 113 is rendered conductive.

If each of the switching transistors 113 to 115 is replaced with the complementary channel type transistor, the voltage detection signal SVDT can be directly applied to its gate. In such a case, there is no need for the switch driving circuit 204'.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. An input buffer for semiconductor devices, comprising:
   an input circuit having at least one NMOS transistor and at least one PMOS transistor, said input circuit receiving an externally applied input signal and generating an internal signal compatible with the input signal; and
   a protection circuit for driving a source-drain voltage of each transistor of said input circuit to zero when a voltage level of said externally applied input signal exceeds a predetermined voltage level.

2. An input buffer according to claim 1, wherein said input circuit comprises a CMOS inverter.

3. An input buffer according to claim 1, wherein said input circuit comprises a CMOS NOR gate.

4. An input buffer for semiconductor devices, comprising:
   a first power source for supplying a first power supply voltage;
   a second power source for supplying a second power supply voltage;
   a CMOS input circuit including an input terminal for receiving an externally applied input signal, a pull-up transistor, a pull-down transistor, wherein said pull-up and pull-down transistors are coupled in series between said first and second power sources, and an output terminal for providing an internal signal compatible with the input signal;
   a voltage detecting circuit for detecting whether a voltage level of said externally applied input signal exceeds a predetermined voltage level and generating a voltage detection signal when the voltage level of said externally applied input signal exceeds the predetermined voltage level;
   a first switch coupled between said first power source and said output terminal of said input circuit and in parallel with said pull-up transistor, said first switch opening and closing in response to the voltage detection signal; and
   a second switch coupled between said pull-down transistor and said second power source, said second switch opening and closing in response to the voltage detection signal.

5. An input buffer according to claim 4, wherein said first and second switches comprise MOS transistors.

6. An input buffer for semiconductor devices comprising:
   a first power source for supplying a first power supply voltage;
   a second power source for supplying a second power supply voltage;
   a CMOS input circuit having a first input terminal for receiving an externally applied input signal, a pull-up transistor, a pull-down transistor, wherein said pull-up and pull-down transistors are coupled in series, and an output terminal for providing an internal signal compatible with the input signal;
   a first switch coupled between said first power source and said pull-up transistor, said first switch opening/closing in response to an externally applied control signal;
   a second switch coupled in parallel with said pull-down transistor, said second switch opening/closing in response to the externally applied control signal;

a voltage detecting circuit for detecting whether a voltage level of the input signal exceeds a predetermined voltage level and generating a voltage detection signal when the voltage level of the input signal exceeds the predetermined voltage level;

a third switch coupled between said first power source and said pull-up transistor and in parallel with said first switch, said third switch opening/closing in response to the voltage detection signal;

a fourth switch coupled between said first power source and said output terminal of said input circuit, said fourth switch opening/closing in response to the voltage detection signal; and a fifth switch coupled between said pull-down transistor and said second power source, said fifth switch opening/closing in response to the voltage detection signal.

7. An input buffer according to claim 6, wherein said first through fifth switches comprise MOS transistors.

8. An input buffer for semiconductor devices comprising:

a CMOS logic gate circuit having at least one NMOS transistor and at least one PMOS transistor, said CMOS logic gate circuit receiving an externally applied input signal and generating an internal signal compatible with the input signal;

a voltage detecting circuit for detecting whether a voltage level of said externally applied input signal exceeds a predetermined voltage level and generating a voltage detection signal when the voltage level of said externally applied input signal exceeds the predetermined voltage level; and a protection circuit for substantially setting a drain voltage of said PMOS transistor to a source voltage thereof in response to the voltage detection signal.

9. An input buffer according to claim 8, wherein said protection circuit comprises MOS transistors.

* * * * *

UNITED STATES PATENT AND TRADEMARK OFFICE
CERTIFICATE OF CORRECTION

PATENT NO : 5,999,390
DATED : December 7, 1999
INVENTOR(S): Baek-Hyung Cho; Choong-Keun Kwak; Ho-Geun Shin It is certified that error appears in the above-identified patent and that said Letters Patent are hereby corrected as shown below:

The Foreign Application Priority Date of Apr. 12, 1997 listed on the first page is incorrect. The correct Foreign Application Priority Date should read December 4, 1997.

Signed and Sealed this

Twenty-fourth Day of April, 2001

*Attest:*

NICHOLAS P. GODICI

*Attesting Officer*     *Acting Director of the United States Patent and Trademark Office*